US012228413B2

(12) United States Patent
Moyal et al.

(10) Patent No.: US 12,228,413 B2
(45) Date of Patent: Feb. 18, 2025

(54) AUTOMATIC ROUTING OPTIMIZATION (71) Applicant: International Business Machines Corporation, Armonk, NY (US)

(72) Inventors: Shailendra Moyal, Pune (IN); Sarbajit K. Rakshit, Kolkata (IN); Partho Ghosh, Kolkata (IN)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 17/807,017

(22) Filed: Jun. 15, 2022

(65) Prior Publication Data
US 2023/0408270 A1 Dec. 21, 2023

(51) Int. Cl.
*G01C 21/34* (2006.01)
(52) U.S. Cl.
CPC ............... *G01C 21/3461* (2013.01)
(58) Field of Classification Search
None
See application file for complete search history.

(56) References Cited

U.S. PATENT DOCUMENTS

| | | | | |
|---|---|---|---|---|
| 10,324,463 | B1* | 6/2019 | Konrardy | G01S 19/39 |
| 10,762,447 | B2* | 9/2020 | Kislovskiy | G06Q 10/02 |
| 2021/0241625 | A1* | 8/2021 | Elisha | G08G 1/202 |
| 2022/0242450 | A1* | 8/2022 | Sokolov | B60W 60/0015 |
| 2023/0077570 | A1* | 3/2023 | Agrawal | G01C 21/3484 |
| | | | | 701/533 |
| 2023/0088950 | A1* | 3/2023 | Tadeu de Paula | |
| | | | | G06Q 10/06315 |
| 2023/0152106 | A1* | 5/2023 | Giovanardi | G01C 21/3461 |
| | | | | 701/533 |

FOREIGN PATENT DOCUMENTS

| | | |
|---|---|---|
| CN | 107507444 A | 12/2017 |
| CN | 109341713 A | 2/2019 |

(Continued)

OTHER PUBLICATIONS

Disclosed Anonymously, "Compute Measurement and Lane Assignment in Multi-Autonomous Vehicle Edge Computing Ecosystem", An IP.com Prior Art Database Technical Disclosure, IP.com No. IPCOM000268010D, IP.com Electronic Publication Date: Dec. 15, 2021, 4 pages, <https://ip.com/IPCOM/000268010>.

(Continued)

*Primary Examiner* — Behrang Badii
*Assistant Examiner* — Paysun Wu
(74) *Attorney, Agent, or Firm* — Stosch Sabo (57) ABSTRACT A processor may receive transportation data associated with one or more vehicles and one or more routes having one or more roads. The processor may analyze the transportation data for one or more vehicle capabilities associated with the one or more vehicles and one or more road capabilities associated with the one or more roads of the one or more routes. The processor may generate one or more simulations associated with the one or more roads and the one or more vehicles. The processor may identify an optimal vehicle from the one or more vehicles and an optimal route from the one or more routes. Identifying the optimal vehicle and the optimal route may be based, at least in part, on the one or more simulations. The processor may assign the optimal vehicle to the optimal route.

20 Claims, 5 Drawing Sheets (56) References Cited

FOREIGN PATENT DOCUMENTS

| CN | 113076897 A | 7/2021 |
|----|-------------|--------|
| WO | 2018058957 A1 | 4/2018 |
| WO | 2020121300 A1 | 6/2020 |

OTHER PUBLICATIONS

Mell, et al., "The NIST Definition of Cloud Computing", National Institute of Standards and Technology, Special Publication 800-145, Sep. 2011, 7 pages.

Unknown, "Smart Roads Start with Smart Infrastructure", Intel, last printed Jun. 1, 2022, 11 pages, <https://www.intel.com/content/www/us/en/transportation/smart-road-infrastructure.html>.

Unknown, "Virginia Smart Roads", Virginia Tech Transportation Institute, last printed Jun. 1, 2022, 6 pages, <https://www.vtti.vt.edu/facilities/virginia-smart-roads.html>.

* cited by examiner

AUTOMATIC ROUTING OPTIMIZATION

BACKGROUND

Aspects of the present disclosure relate generally to the field of artificial intelligence, and more particularly to optimizing transportation routing.

As technology associated with Internet of Things (IoT) devices and other smart devices has advanced, the variety of areas this technology can be applied to has also developed. Industries, such as the transportation industry, have significantly benefited from this technology. The ability to receive information associated with vehicles and various roads has allowed for users to be more mindful of their travel plans and easily avoid issues that may result in unnecessary delays.

SUMMARY

Embodiments of the present disclosure include a method, computer program product, and system for optimizing vehicle transportation. A processor may receive transportation data associated with one or more vehicles and one or more routes having one or more roads. The processor may analyze the transportation data for one or more vehicle capabilities associated with the one or more vehicles and one or more road capabilities associated with the one or more roads of the one or more routes. The processor may generate one or more simulations associated with the one or more roads and the one or more vehicles. The processor may identify an optimal vehicle from the one or more vehicles and an optimal route from the one or more routes. Identifying the optimal vehicle and the optimal route may be based, at least in part, on the one or more simulations. The processor may assign the optimal vehicle to the optimal route.

The above summary is not intended to describe each illustrated embodiment or every implementation of the present disclosure.

BRIEF DESCRIPTION OF THE DRAWINGS

The drawings included in the present disclosure are incorporated into, and form part of, the specification. They illustrate embodiments of the present disclosure and, along with the description, serve to explain the principles of the disclosure. The drawings are only illustrative of certain embodiments and do not limit the disclosure.

While the embodiments described herein are amenable to various modifications and alternative forms, specifics thereof have been shown by way of example in the drawings and will be described in detail. It should be understood, however, that the particular embodiments described are not to be taken in a limiting sense. On the contrary, the intention is to cover all modifications, equivalents, and alternatives falling within the spirit and scope of the disclosure.

DETAILED DESCRIPTION

Aspects of the present disclosure relate generally to the field of artificial intelligence, and, more particularly, to optimizing transportation routing. While the present disclosure is not necessarily limited to such applications, various aspects of the disclosure may be appreciated through a discussion of various examples using this context.

GPS (global positioning systems) devices, easily found in vehicles and even mobile devices, can provide precise directions to any location with a few button clicks. Though readily available, very few GPS devices consider the effect of a generated route in conjunction with the various capabilities or limitations of a vehicle. More particularly, few GPS devices consider and how those vehicle capabilities or limitations may affect not only arrival time to a particular location, but also how the various aspects of the route may negatively affect a vehicle traveling the route (e.g., route may result in vehicle damage). As such there is a desire for a solution that allows a route to be chosen based on the capabilities/limitations of the vehicle and the capabilities/limitations of the particular route that allows for an optimal arrival time (e.g., minimized delays) and mitigates potential vehicle damage.

Before turning to the FIGS. it is noted that the benefits/novelties and intricacies of the proposed solution are that:

The system may be configured to estimate the minimum aggregated capabilities (e.g., computing capabilities) that may be required for each vehicle to travel through different routes. The estimated minimum aggregated computing capabilities may be based on contextual driving situations (e.g., road capabilities, vehicle capabilities, road conditions, etc.). Using this information, the system may assign the appropriate or optimal route to one or more different vehicles to ensure the vehicle assigned to a particular route sufficiently address the driving context (e.g., road conditions) associated with that route.

The system may be configured to analyze the one or more vehicles available and the one or more routes to determine road capabilities (e.g., smartness of the road/how many smart devices are associated with or connected to the road), vehicle capabilities. The system may then use these road capabilities and vehicle capabilities to assign the one or more vehicles to a route while maintaining the necessary traffic speed.

The system may assign or recommend one or more different routes based on the smartness associated with different routes to one or more vehicles, based on the vehicle's capability. The system may also be configured to identify what level of smartness is required by each route. The system may then recommend how the smartness of the route may be improved (e.g., adding one or more smart devices to one or more roads of the route).

The system may be configured to predict the contextual situation (e.g., road conditions) by analyzing transportation data (e.g., weather conditions, road conditions, minimum traffic speed requirements, the number of available vehicles, etc.). The system may use the contextual situation to estimate the aggregated capabilities (e.g., vehicle capabilities and road capabilities) that may be needed for a particular vehicle to travel a particular route.

The system may be configured to generate one or more digital twins and perform various digital twin simulations. These digital twin simulations may be associated with the one or more routes and/or smart roads and the one or more vehicles. In some embodiments, the system may be configured to perform aggregated capability simulations. These aggregated capability simulations may be used to identify what types of contextual situations (e.g., road conditions) may be addressed by the system and to ensure the appropriate or optimal vehicle is assigned to the optimal route.

The system may be configured to use digital twin technology to vary properties associated with the one or more vehicles and one or more routes to determine vehicle and road capabilities/smartness. In some embodiments, the system may use the digital twin simulations to generate aggregate mapping of different situations, the vehicle or road's need-based capability requirement, and the ranking of the one or more different routes.

The system may assign different routes depending on multiple attributes. These multiple attributes may include, but are not limited to, vehicle capabilities, road capabilities (e.g., level of road smartness), and the context or reason behind the vehicle traveling to a particular location. The system may update the ranking of the routes and generate additional capabilities needed to manage the vehicle on the route. This can be used by the system to enhance the smartness capability as well as provide the vehicle with more resources on the way to a particular location. For example, the system may provide the vehicle with access to mechanical services to make repairs or may provide the vehicle with access to gasoline to replace the fuel consumed during the vehicle's travels.

Figure 1:
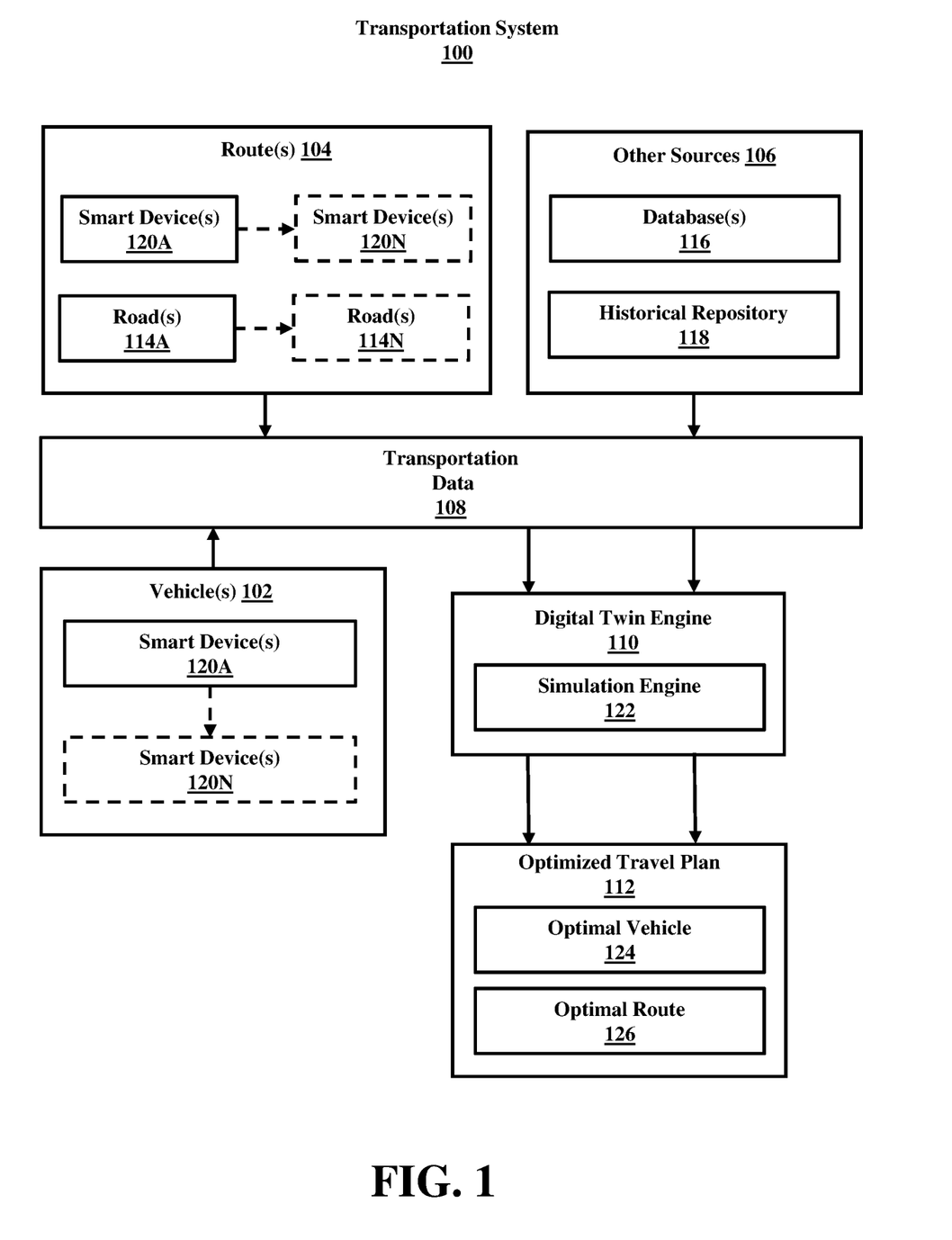
FIG. 1 illustrates a block diagram of an example transportation system, in accordance with aspects of the present disclosure.

Referring now to FIG. 1, illustrated is a block diagram of an example transportation system 100 for optimizing vehicle transportation, in accordance with aspects of the present disclosure. FIG. 1 provides an illustration of only one implementation and does not imply any limitations with regard to the environments in which different embodiments may be implemented. Many modifications to the depicted environment may be made by those skilled in the art without departing from the scope of the invention as recited by the claims.

As depicted in FIG. 1, transportation system 100 may be configured to include one or more vehicle(s) 102, one or more route(s) 104, one or more other sources 106, transportation data 108, digital twin engine 110, and optimized travel plan 112. In embodiments, transportation system 100 may be configured to analyze transportation data 108 to identify an optimal vehicle and an optimal route to travel to a particular location. The optimal vehicle may be identified from one or more vehicles 102 and the optimal route may be selected from one or more vehicles 104. In embodiments, one or more vehicles 102 may include any type of machine capable of traveling from one location to another location. For example, one or more vehicles 102 may refer to any number and/or type of cars, recreational vehicles, tractor trailers, and/or airplanes. While in some embodiments vehicles 102 may all be the same or similar type of vehicle, in other embodiments vehicles 102 may include different types of vehicles. For example, in one embodiment, one or more vehicles 102 may refer to one or more cars while in another embodiment, one or more vehicles 102 may refer to a group of vehicles having a couple of cars, an airplane, and a tractor trailer. In some embodiments, one or more vehicles 102 may be configured to make independent actions.

In embodiments, transportation system 100 may include one or more routes 104. One or more routes 104 may include one or more roads 114 or portions of a route that when configured together may comprise a particular route (e.g., of the one or more routes 114) to a particular location that may be traveled by one or more vehicles 102. In an example embodiment, transportation system 100 may include Road A, Road B, Road C, Road D, and Road E (e.g., one or more roads). Transportation system 100 may identify one or more routes 104 from the one or more roads 114 to a particular location. Using the above example embodiment, transportation system 100 may identify a first route that may include Road A and Road C and a second route that may include Road B, Road D, and Road E.

In embodiments, transportation system 100 may be configured to receive transportation data 108 associated with one or more vehicles 102 and one or more routes 104 (e.g., having one or more roads 114). Transportation data may include, but is not limited to, information or data associated with: i) the number and type of vehicles included in one or more vehicles 102 (e.g., the number of cars and trucks associated with transportation system 100); ii) the capabilities (e.g., vehicle capabilities) of the one or more vehicles 102 (e.g., weight limits, speed ranges, size of fuel tank, etc.); iii) the capabilities of the one or more routes 104 and/or the one or more roads 114 (e.g., road capabilities); iv) the number and type of smart devices associated with the one or more vehicles 102 and/or with the one or more roads 114 associated with the one or more routes 104; v) information associated with external stimuli that may affect or impact the road conditions of the one or more roads 114 (e.g., impact of the road condition on one or more vehicles 102); vi) environmental information associated with a particular road associated with a particular route; vii) real-time information associated with the one or more vehicles 102 (e.g., real-time information associated with how a road condition associated with a particular road of a route is impacting a particular vehicle); viii) real-time information associated with the one or more routes 104 and/or the one or more roads 114 associated with a route (e.g., data associated with how a rainstorm is impacting a particular road associated with a particular route); ix) the aggregate vehicle capabilities and road capabilities and possible impacts on the optimized travel plan 112; xi) information/data generated from various analyses contemplated herein (e.g., information/data generated by AI and machine learning analysis via digital twin engine 110 and/or simulation engine 122); xii) information associated with characteristics of the one or more roads included in a particular route (e.g., sharp turns in the road, minimum and maximum legal speed limits); and/or xiii) other sources 106, such as databases 116 having information/data associated with vehicles and/or routes (e.g., having one or more roads) that may be the same or similar to the vehicles 102 and routes 104 used in transportation system 100 (e.g., such data may be used to perform one or more simulations via digital twin engine 110).

In embodiments, transportation system 100 may be configured to store transportation data 108 collected over time in historical repository 118. Historical repository 118 may include any transportation data 108 contemplated herein. In embodiments, transportation system 100 may access the historical repository 118 to generate one or more simulations using AI and machine learning capabilities (e.g., digital twin engine 110/simulation engine 122). The information generated from these analyses may be considered transportation data 108 and may also be stored within historical repository 118.

In embodiments, transportation system 100 may be configured to receive/collect transportation data 108 from one or more smart devices 120A-N. Smart devices 120A-N may include, but are not limited to devices such as, Internet of Things (IoT) devices (e.g., scanning module IoT enabled devices), cameras, infrared sensors, ultrasounds, chemical sensors, any device that may be associated with vehicle capabilities and/or road capabilities (e.g., devices associated with the vehicle or road making/performing independent actions), or any combination thereof. In embodiments, transportation system 100 may configure one or more smart devices 120A-N to receive/collect transportation data 108 associated with transportation system 100 in real-time and/or to collect transportation data 108 over a particular time duration. Such transportation data 108 may be stored in historical repository 118 and accessed as needed by transportation system 100 by digital twin engine 110 or simulation engine 122 (e.g., when using AI and machine learning capabilities performing the various simulations/analyses contemplated herein).

Smart devices 120A-N may be associated with or configured within one or more vehicles 102 as well as one or more routes 104. In embodiments where one or more smart devices 120A-N are associated with multiple vehicles 102, each vehicle may be configured with the same smart devices or, alternatively, with different types of smart devices. For example, transportation system 100 may have several vehicles (e.g., vehicle 102) with different combinations of smart devices 120A-N. In some embodiments, transportation system 100 may configured these one or more smart devices 120A-N to provide the vehicle with one or more vehicle capabilities. These vehicle capabilities may include, but are not limited to, input gathering systems (e.g., collection of transportation data 108), computing resources (e.g., for driving computations), and communications between vehicle 102 and route 104 and/or roads 114A-N.

Similarly, in embodiments where one or more smart devices 120A-N are associated with multiple routes 104 and the various one or more roads 114A-N comprising each route 104, each route 104/road 114 may be configured with the same smart devices or, alternatively, with different types of smart devices. For example, transportation system 100 may have several routes 104/roads 114A-N (e.g., vehicle 102) with different combinations of smart devices 120A-N. In some embodiments, transportation system 100 may configured these one or more smart devices 120A-N to provide the route 104/road 114 with one or more road capabilities. These road capabilities may include, but are not limited to, input gathering systems (e.g., identifying road conditions, such as data associated with the flow of traffic), computing resources (e.g., for vehicle traveling computations), and communications between vehicle 102 and route 104 and/or roads 114A-N.

In some embodiments, transportation system 100 may be configured to analyze transportation data 108 using artificial intelligence (AI) and machine learning techniques. In some embodiments, transportation system 100 may analyze transportation data associated with the one or more vehicles 102 and one or more routes 104 to determine/identify one or more vehicle capabilities associated with the one or more vehicles and road capabilities associated with one or more routes 104. In some embodiments, each route 104 may have one or more roads 114A-N comprising each route. While in some embodiments, a particular route (e.g., of one or more routes 104) may have a set or group of different road capabilities that apply to the entire route, in other embodiments a particular route may have a different road capability (or set of road capabilities) for each of the one or more roads comprising the particular route.

In embodiments, transportation system 100 may be configured to analyze transportation data 108. In these embodiments, transportation system 100 may analyze generate one or more simulations using one or more digital twins generated by digital twin engine 110. Digital twin engine 110 may be enable with AI and machine learning technology. Digital twin engine 110 may generate one or more digital twins associated with one or more vehicles 102, one or more routes 104, one or more roads 114A-N, transportation data 108, or any combination thereof. While in some embodiments, digital twin engine 110 may be configured to perform any and all analyses contemplated herein, in other embodiments, digital twin engine 110 may be configured to further include simulation engine 122 (e.g., enable with AI and machine learning technology). Simulation engine 122 may be configured to generate one or more simulations using the one or more digital twins generated by digital twin engine 110. In some embodiments, simulation engine 122 may replace digital twin engine 110 and be configured by transportation system 100 to perform any of the various analyses contemplated herein.

In embodiments, transportation system 100 may analyze transportation data 108 to identify an optimized travel plan 112. Optimized travel plan 112 may refer to the optimal method (e.g., optimal vehicle 124 and optimal route 126) of traveling to a particular location using one or more vehicles 102 and one or more routes 104. In optimized travel plan 112, transportation 100 may identify an optimal vehicle 124 from one of the one or more vehicles 102 and an optimal route 126 from one or more routes 104. In these embodiments, transportation system 100 may be configured to base the identification of optimal vehicle 124 and optimal route 126 on one or more simulations (e.g., digital twin engine 110/simulation engine 122). Once identified, transportation system 100 may assign the optimal vehicle 124 to the optimal route 126. While in some embodiments, one vehicle out of the one or more vehicles 102 may be identified as an optimal vehicle 124 and assigned to optimal route 126, in other embodiments, more than one vehicle may be identified as an optimal vehicle 124. In such embodiments where more than one vehicle (e.g., of the one or more vehicles 102) is identified as an optimal vehicle 124, transportation system 100 may either assign all of the optimal vehicles 122 to a single identified optimal route 126 or, alternatively, may assign a subset of the vehicles identified as optimal vehicles (e.g., one or more of the total optimal vehicle 124) to a particular optimal route and the remaining vehicles (e.g., those optimal vehicles 122 not included in the subset) to different optimal route.

In some embodiments, transportation system 100 may be configured to identify optimal vehicle 124 and optimal route 126 using transportation data 108 regarding the one or more vehicle capabilities, associated with the one or more vehicles 102, and the road capabilities, associated with the one or more routes 104 (e.g., one or more roads 114A-N). In these embodiments, transportation system 100 may be configured to analyze (e.g., digital twin engine 110/simulation engine 122) the one or more vehicle capabilities associated with each of the one or more vehicles 102 and the one or more route capabilities associated with each of the one or more routes 104. In such embodiments, transportation system 100 may use these analyzes to identify one or more aggregated capabilities. Aggregated capabilities may refer to the total amount of capabilities associated with a particular vehicle having a particular set of vehicle capabilities that correspond to the road capabilities associated with a particular route. In embodiments, when a particular vehicle and particular route have corresponding capabilities, the vehicle is more likely to arrive at the particular location without damage or time delay. In embodiments, transportation system 100 may assign those vehicles 102 and routes 104 with the highest amount of aggregated capabilities as optimal vehicles 122 and optimal routes 124.

In embodiments, transportation system 100 may simulate transportation data 108 associated with one or more roads 114A-N of a particular route 104. In some embodiments, this transportation data 108 may be collected in real-time (e.g., via one or more smart devices 120A-N) and reflect the current conditions of various roads 114A-N or routes associated with transportation system 100. Using digital twin engine 110, transportation system 100 may be configured to identify one or more road conditions associated with a particular road of the one or more roads 114A-N. A road condition may refer to any situation that may affect a vehicle while the vehicle is traveling road while trying to complete a route to a particular location. For example, a road condition may include, but is not limited to, weather conditions (e.g., high wind speeds, heavy rainfall, earthquake, etc.), the flow of traffic (e.g., traffic jams, slow traffic, or no traffic, etc.), potential hazards (e.g., downed powerlines across a road).

In embodiments, transportation system 100 may generate one or more simulations (e.g., via digital twin 110 and/or simulation engine 122) associated with the one or more road conditions identified as well as one or more vehicles 102 and one or more routes 104. In these embodiments, transportation system 100 may use these simulations to determine one or more impacts of the road conditions on one or more vehicles 102, were the one or more vehicles to travel a route 104 using the road associated with the identified road condition. Using the aforementioned simulations, transportation system 100 may determine whether the impact of the one or more road conditions may result in damage to the one or more vehicles (e.g., optimal vehicle 124 assigned to travel the road during the optimal route 126) and/or a delay in the vehicle arriving at the particular location.

In embodiments, transportation system 100 may simulate the identified road condition and transportation data 108 to predict if a particular vehicle of the one or more vehicles 102 is an optimal vehicle 124 for that particular route (e.g., does the road condition have an impact on the one or more vehicles 102 and/or the one or more routes 104). Transportation system 100 may determine this if the simulation indicates that the vehicle can arrive at the particular location via that particular route in the most time efficient method safely and without damage. If transportation system 100 determines that the vehicle is the optimal vehicle 124 for that particular route, transportation system 100 may identify the particular route as an optimal route 126. In some embodiments, transportation system 100 may be configured to identify a minimum speed for a vehicle 102 (e.g., optimal vehicle 124) to travel a route 104 (e.g., optimal route 126). In these embodiments, transportation system 100 may base the minimum speed for a vehicle (e.g., optimal vehicle 124 traveling optimal route 126) on the simulated impact of one or more road conditions on vehicle 102.

In embodiments where an optimal vehicle 124 has been assigned to an optimal route 126 and transportation system 100 identifies in real time of an unexpected road condition that may negatively impact the optimal vehicle (e.g., result in a delayed arrival time to the particular location or damage to the vehicle), transportation system 100 may reconfigure the optimal route to include one or more different roads. In these embodiments, transportation system 100 may reconfigure the optimal route by identifying the original one or more roads associated with optimal route 126 and determine if there are any connecting roads or alternative pathways that may allow the optimal vehicle 124 to avoid the road condition. In such embodiments, transportation system 100 may update the optimal route based on the impact simulations to form an updated optimal route for the optimal vehicle 124 that has already initiated travel through the originally identified optimal route 126. Once an updated optimal route has been identified/formed, transportation system 100 may dynamically assign optimal vehicle 124 to the updated optimal route. Such embodiments may mitigate potential delays and vehicle damage that may result from unexpected road conditions.

In some embodiments, transportation system 100 may be configured to analyze transportation data 108 associated with the one or more road capabilities (e.g., associated with the one or more roads). In these embodiments, transportation system 100 may identify whether there are any data gaps in the transportation data 108 associated with the one or more roads 114A-N of the one or more routes 104. A data gap may result if there are one or more smart devices 120A-N configured to collect a particular kind of transportation data 108 associated with some of the one or more roads 114A-N pertaining to a particular route but not all of the roads associated with the particular route. In such embodiments, if transportation system 100 is unable to collect a particular type of transportation data (e.g., traffic flow information) associated with some route portions (e.g., a road of the one or more roads comprising a route 104), transportation system 100 may be unable to produce accurate simulations. As such, transportation system 100 may analyze transportation data 108 and determine if a data gap exists. In embodiments where a data gap is identified, transportation system 100 may recommend one or more additional smart devices (e.g., one or more smart devices 120A-N) to be added to the one or more roads where a data gap has been identified.

Figure 2:
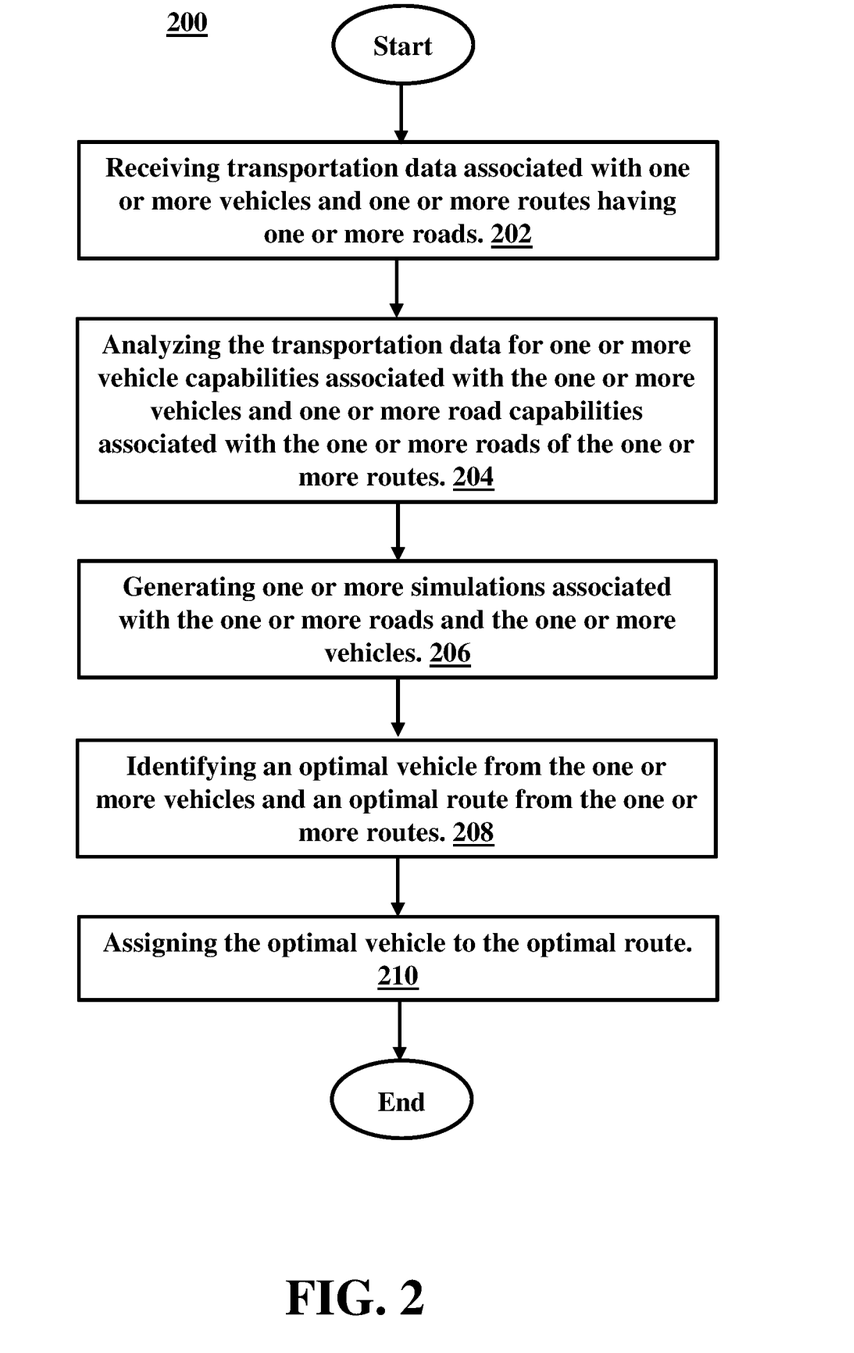
FIG. 2 illustrates a flowchart of an example method for optimizing transportation, in accordance with aspects of the present disclosure.

Referring now to FIG. 2, a flowchart illustrating an example method 200 for optimizing vehicle transportation, in accordance with embodiments of the present disclosure. FIG. 2 provides an illustration of only one implementation and does not imply any limitations with regard to the environments in which different embodiments may be implemented. Many modifications to the depicted environment may be made by those skilled in the art without departing from the scope of the invention as recited by the claims.

In some embodiments, the method 200 begins at operation 202 where a processor may receive transportation data associated with one or more vehicles and one or more routes having one or more roads. In some embodiments, the method 200 proceeds to operation 204.

At operation 204, a processor may analyze the transportation data for one or more vehicle capabilities associated with the one or more vehicles and one or more road capabilities associated with the one or more roads of the one or more routes. In some embodiments, the method 200 proceeds to operation 206.

At operation 206, a processor may generate one or more simulations associated with the one or more roads and the one or more vehicles. In some embodiments, the method 200 may proceed to operation 208.

At operation 208, a processor may identify an optimal vehicle from the one or more vehicles and an optimal route from the one or more routes. In some embodiments, identifying the optimal vehicle and the optimal route is based, at least in part, on the one or more simulations. In some embodiments, the method 200 may proceed to operation 210.

At operation 210, a processor may assign the optimal vehicle to the optimal route. In some embodiments, as depicted in FIG. 2, after operation 208, the method 200 may end.

In some embodiments, discussed below there are one or more operations of the method 200 not depicted for the sake of brevity and which are discussed throughout this disclosure. Accordingly, in some embodiments the one or more simulations generated may be based, at least in part, on one or more digital twins of the one or more roads and the one or more vehicles.

In some embodiments, the processor may identify one or more aggregated capabilities of the optimal vehicle and the optimal route.

In some embodiments, the processor may simulate transportation data associated with the one or more roads. The processor may use these simulations to identify a road condition associated with the one or more roads. In these embodiments, the processor may use the road conditions to predict the impact of the road condition on the one or more vehicles and the one or more roads. In some embodiments, the processor may identify a minimum vehicle speed for the one or more vehicle. In these embodiments, the minimum vehicle speed is based, at least in part, on the impact of the road condition on the one or more vehicles and the one or more roads. In some embodiments, the processor may update the optimal route based on the impact to form an updated optimal route. In these embodiments, the processor may then dynamically assign the optimal vehicle to the updated optimal route.

In some embodiments, the processor may analyze the transportation data associated with the one or more road capabilities associated with the one or more roads. The processor may identify a data gap from the transportation data. In some embodiments, the data gap may be associated with the one or more roads. The processor may then recommend one or more additional smart devices for the one or more roads based, at least in part, on the data gap.

It is to be understood that although this disclosure includes a detailed description on cloud computing, implementation of the teachings recited herein are not limited to a cloud computing environment. Rather, embodiments of the present disclosure are capable of being implemented in conjunction with any other type of computing environment now known or later developed.

Cloud computing is a model of service delivery for enabling convenient, on-demand network access to a shared pool of configurable computing resources (e.g., networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of portion independence in that the consumer generally has no control or knowledge over the exact portion of the provided resources but may be able to specify portion at a higher level of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported, providing transparency for both the provider and consumer of the utilized service.

Service Models are as follows:

Software as a Service (SaaS): the capability provided to the consumer is to use the provider's applications running on a cloud infrastructure. The applications are accessible from various client devices through a thin client interface such as a web browser (e.g., web-based e-mail). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (e.g., mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for load-balancing between clouds).

A cloud computing environment is service oriented with a focus on statelessness, low coupling, modularity, and semantic interoperability. At the heart of cloud computing is an infrastructure that includes a network of interconnected nodes.

Figure 3A:
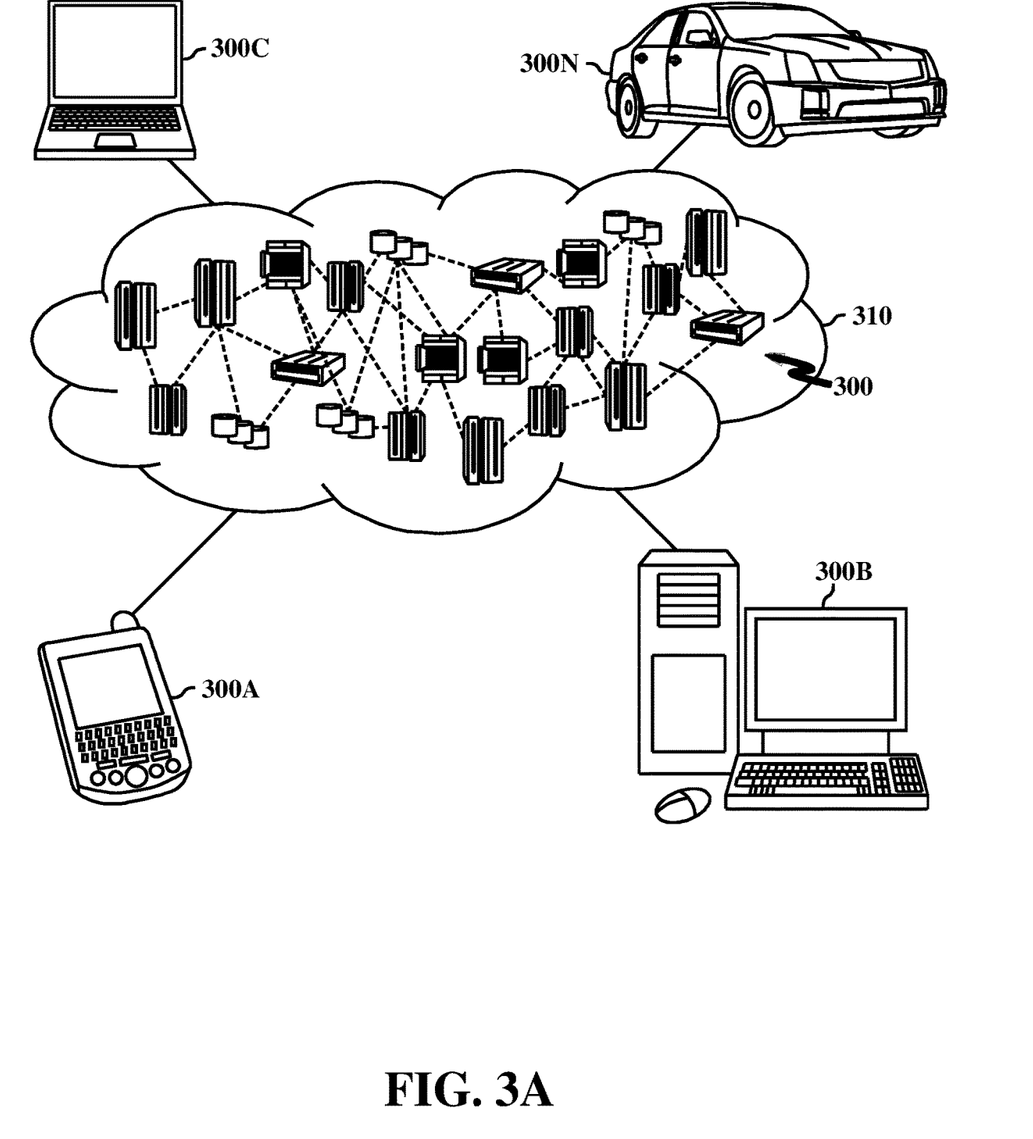
FIG. 3A illustrates a cloud computing environment, in accordance with aspects of the present disclosure.

FIG. 3A, illustrated is a cloud computing environment 310 is depicted. As shown, cloud computing environment 310 includes one or more cloud computing nodes 300 with which local computing devices used by cloud consumers, such as, for example, personal digital assistant (PDA) or cellular telephone 300A, desktop computer 300B, laptop computer 300C, and/or automobile computer system 300N may communicate. Nodes 300 may communicate with one another. They may be grouped (not shown) physically or virtually, in one or more networks, such as Private, Community, Public, or Hybrid clouds as described hereinabove, or a combination thereof.

This allows cloud computing environment 310 to offer infrastructure, platforms and/or software as services for which a cloud consumer does not need to maintain resources on a local computing device. It is understood that the types of computing devices 300A-N shown in FIG. 3A are intended to be illustrative only and that computing nodes 300 and cloud computing environment 310 can communicate with any type of computerized device over any type of network and/or network addressable connection (e.g., using a web browser).

Figure 3B:
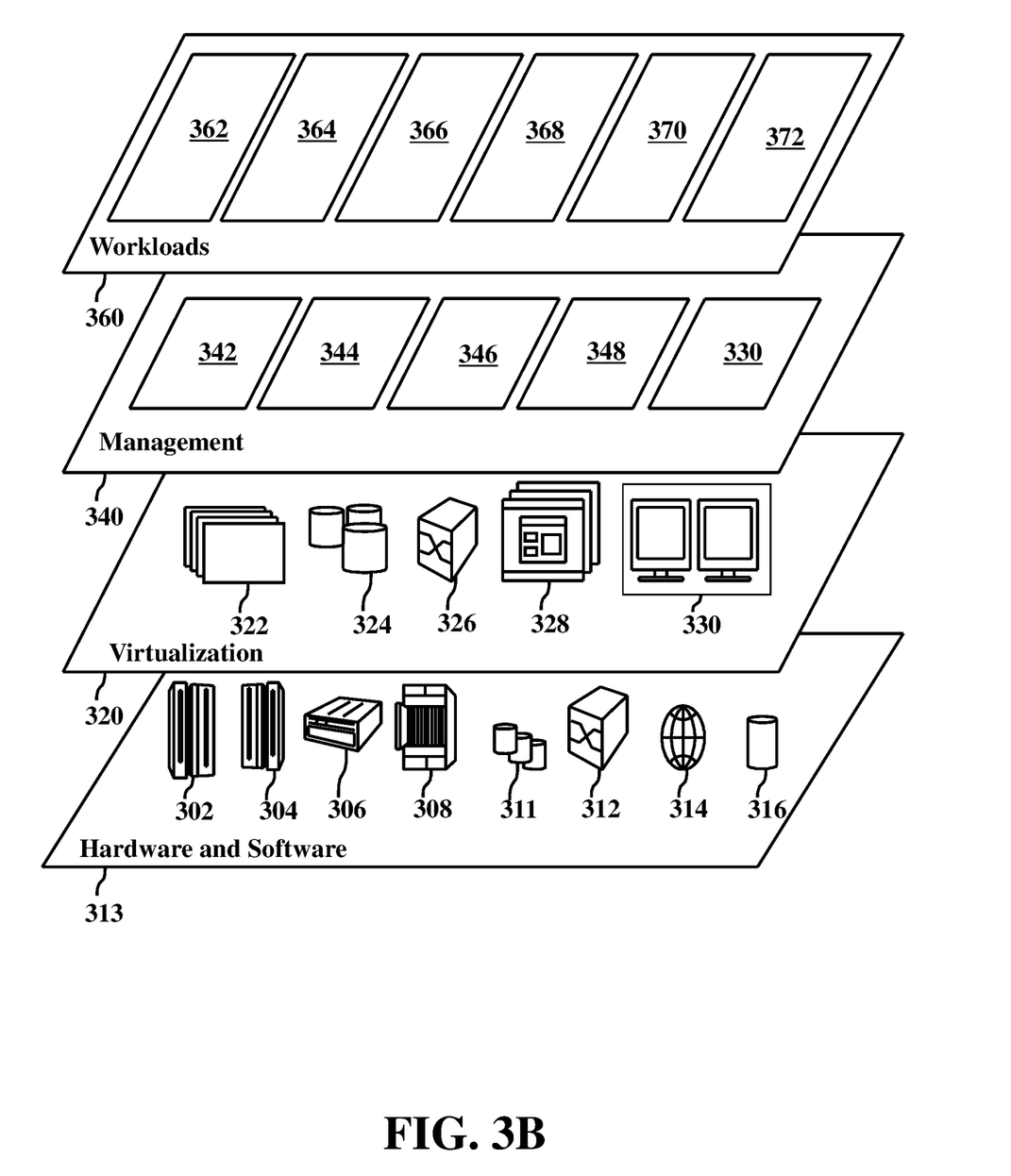
FIG. 3B illustrates abstraction model layers, in accordance with aspects of the present disclosure.

FIG. 3B, illustrated is a set of functional abstraction layers provided by cloud computing environment 310 (FIG. 3A) is shown. It should be understood in advance that the components, layers, and functions shown in FIG. 3B are intended to be illustrative only and embodiments of the disclosure are not limited thereto. As depicted below, the following layers and corresponding functions are provided.

Hardware and software layer 315 includes hardware and software components. Examples of hardware components include: mainframes 302; RISC (Reduced Instruction Set Computer) architecture based servers 304; servers 306; blade servers 308; storage devices 311; and networks and networking components 312. In some embodiments, software components include network application server software 314 and database software 316.

Virtualization layer 320 provides an abstraction layer from which the following examples of virtual entities may be provided: virtual servers 322; virtual storage 324; virtual networks 326, including virtual private networks; virtual applications and operating systems 328; and virtual clients 330.

In one example, management layer 340 may provide the functions described below. Resource provisioning 342 provides dynamic procurement of computing resources and other resources that are utilized to perform tasks within the cloud computing environment. Metering and Pricing 344 provide cost tracking as resources are utilized within the cloud computing environment, and billing or invoicing for consumption of these resources. In one example, these resources may include application software licenses. Security provides identity verification for cloud consumers and tasks, as well as protection for data and other resources. User portal 346 provides access to the cloud computing environment for consumers and system administrators. Service level management 348 provides cloud computing resource allocation and management such that required service levels are met. Service Level Agreement (SLA) planning and fulfillment 350 provide pre-arrangement for, and procurement of, cloud computing resources for which a future requirement is anticipated in accordance with an SLA.

Workloads layer 360 provides examples of functionality for which the cloud computing environment may be utilized. Examples of workloads and functions which may be provided from this layer include: mapping and navigation 362; software development and lifecycle management 364; virtual classroom education delivery 366; data analytics processing 368; transaction processing 370; and optimized travel simulation 372.

Figure 4:
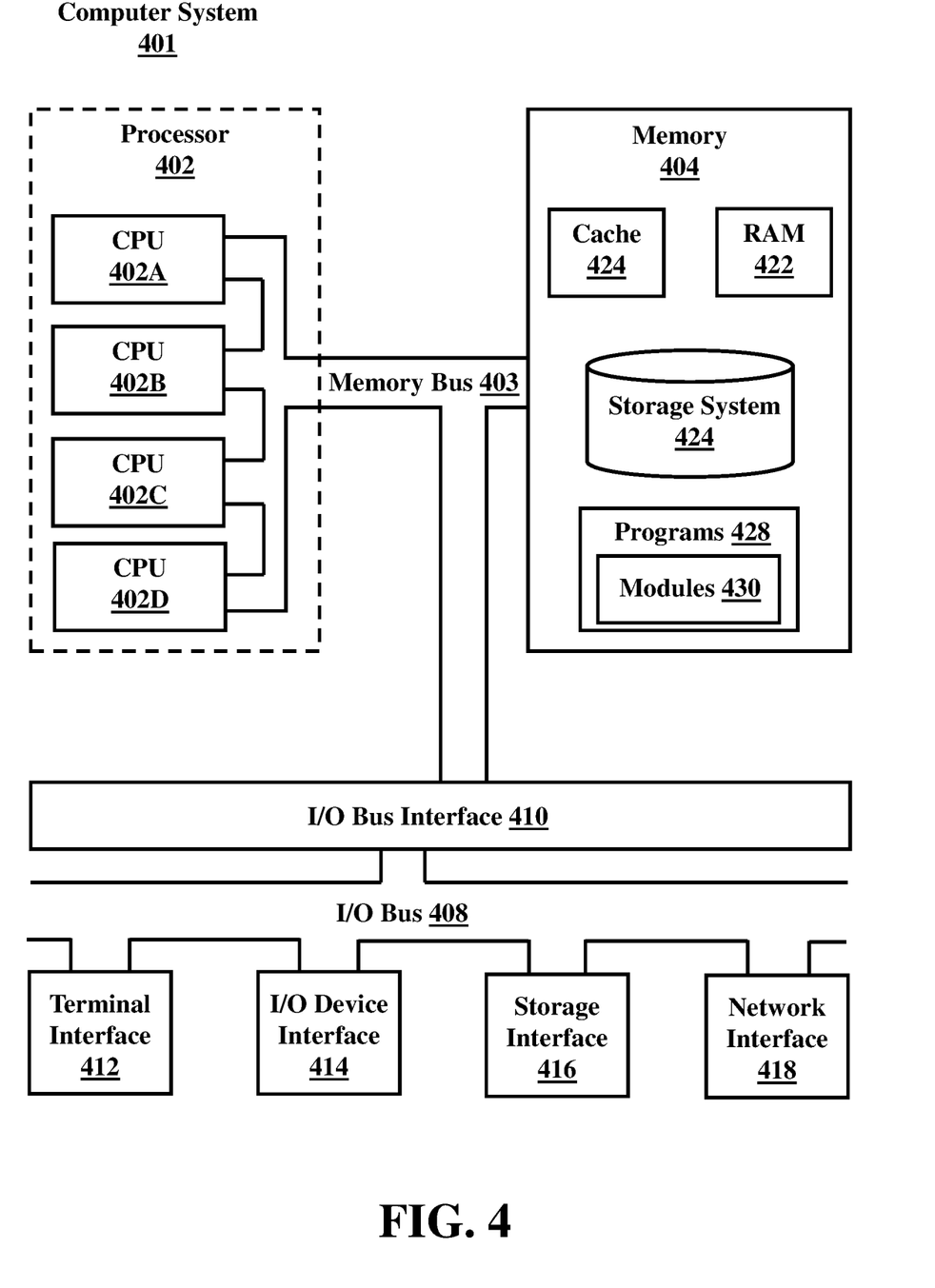
FIG. 4 illustrates a high-level block diagram of an example computer system that may be used in implementing one or more of the methods, tools, and modules, and any related functions, described herein, in accordance with aspects of the present disclosure.

FIG. 4, illustrated is a high-level block diagram of an example computer system 401 that may be used in implementing one or more of the methods, tools, and modules, and any related functions, described herein (e.g., using one or more processor circuits or computer processors of the computer), in accordance with embodiments of the present disclosure. In some embodiments, the major components of the computer system 401 may comprise one or more CPUs 402, a memory subsystem 404, a terminal interface 412, a storage interface 416, an I/O (Input/Output) device interface 414, and a network interface 418, all of which may be communicatively coupled, directly or indirectly, for intercomponent communication via a memory bus 403, an I/O bus 408, and an I/O bus interface unit 410.

The computer system 401 may contain one or more general-purpose programmable central processing units (CPUs) 402A, 402B, 402C, and 402D, herein generically referred to as the CPU 402. In some embodiments, the computer system 401 may contain multiple processors typical of a relatively large system; however, in other embodiments the computer system 401 may alternatively be a single CPU system. Each CPU 402 may execute instructions stored in the memory subsystem 404 and may include one or more levels of on-board cache.

System memory 404 may include computer system readable media in the form of volatile memory, such as random access memory (RAM) 422 or cache memory 424. Computer system 401 may further include other removable/non-removable, volatile/non-volatile computer system storage media. By way of example only, storage system 426 can be provided for reading from and writing to a non-removable, non-volatile magnetic media, such as a "hard drive." Although not shown, a magnetic disk drive for reading from and writing to a removable, non-volatile magnetic disk (e.g., a "floppy disk"), or an optical disk drive for reading from or writing to a removable, non-volatile optical disc such as a CD-ROM, DVD-ROM or other optical media can be provided. In addition, memory 404 can include flash memory, e.g., a flash memory stick drive or a flash drive. Memory devices can be connected to memory bus 403 by one or more data media interfaces. The memory 404 may include at least one program product having a set (e.g., at least one) of program modules that are configured to carry out the functions of various embodiments.

One or more programs/utilities 428, each having at least one set of program modules 430 may be stored in memory 404. The programs/utilities 428 may include a hypervisor (also referred to as a virtual machine monitor), one or more operating systems, one or more application programs, other program modules, and program data. Each of the operating systems, one or more application programs, other program modules, and program data or some combination thereof, may include an implementation of a networking environment. Programs 428 and/or program modules 430 generally perform the functions or methodologies of various embodiments.

Although the memory bus 403 is shown in FIG. 4 as a single bus structure providing a direct communication path among the CPUs 402, the memory subsystem 404, and the I/O bus interface 410, the memory bus 403 may, in some embodiments, include multiple different buses or communication paths, which may be arranged in any of various forms, such as point-to-point links in hierarchical, star or web configurations, multiple hierarchical buses, parallel and redundant paths, or any other appropriate type of configuration. Furthermore, while the I/O bus interface 410 and the I/O bus 408 are shown as single respective units, the computer system 401 may, in some embodiments, contain multiple I/O bus interface units 410, multiple I/O buses 408, or both. Further, while multiple I/O interface units are shown, which separate the I/O bus 408 from various communications paths running to the various I/O devices, in other embodiments some or all of the I/O devices may be connected directly to one or more system I/O buses.

In some embodiments, the computer system 401 may be a multi-user mainframe computer system, a single-user system, or a server computer or similar device that has little or no direct user interface, but receives requests from other computer systems (clients). Further, in some embodiments, the computer system 401 may be implemented as a desktop computer, portable computer, laptop or notebook computer, tablet computer, pocket computer, telephone, smartphone, network switches or routers, or any other appropriate type of electronic device.

It is noted that FIG. 4 is intended to depict the representative major components of an exemplary computer system 401. In some embodiments, however, individual components may have greater or lesser complexity than as represented in FIG. 4, components other than or in addition to those shown in FIG. 4 may be present, and the number, type, and configuration of such components may vary.

As discussed in more detail herein, it is contemplated that some or all of the operations of some of the embodiments of methods described herein may be performed in alternative orders or may not be performed at all; furthermore, multiple operations may occur at the same time or as an internal part of a larger process.

The present disclosure may be a system, a method, and/or a computer program product at any possible technical detail level of integration. The computer program product may include a computer readable storage medium (or media) having computer readable program instructions thereon for causing a processor to carry out aspects of the present disclosure.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present disclosure may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present disclosure.

Aspects of the present disclosure are described herein with reference to flowchart illustrations and/or block diagrams of methods, apparatus (systems), and computer program products according to embodiments of the disclosure. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/ or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present disclosure. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be accomplished as one step, executed concurrently, substantially concurrently, in a partially or wholly temporally overlapping manner, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

Although the present disclosure has been described in terms of specific embodiments, it is anticipated that alterations and modification thereof will become apparent to the skilled in the art. Therefore, it is intended that the following claims be interpreted as covering all such alterations and modifications as fall within the true spirit and scope of the disclosure.

What is claimed is:

1. A computer-implemented method, the method comprising:
   receiving, by a processor, transportation data associated with one or more vehicles and one or more routes having one or more roads;
   analyzing the transportation data for one or more vehicle capabilities associated with the one or more vehicles and one or more road capabilities associated with the one or more roads of the one or more routes, wherein the one or more road capabilities are based on a level of smartness associated with at least a portion of the one or more roads;
   generating one or more simulations associated with the one or more roads and the one or more vehicles;
   identifying, from the one or more simulations, one or more instances of vehicle damage, associated with a particular vehicle from the one or more vehicles, from one or more unexpected road conditions;
   identifying an optimal vehicle from the one or more vehicles and an optimal route from the one or more routes, wherein identifying the optimal vehicle and the optimal route is based on the one or more simulations and the one or more unexpected road conditions, wherein the optimal vehicle is identified based on having no vehicle damage within the one or more simulations; and
   directing the optimal vehicle to the optimal route.

2. The method of claim 1, wherein the one or more simulations are based, at least in part, on one or more digital twins of the one or more roads and the one or more vehicles.

3. The method of claim 1, further comprising:
   identifying one or more aggregated capabilities of the optimal vehicle and the optimal route.

4. The method of claim 1, further comprising:
   simulating the transportation data associated with the one or more roads;
   identifying a road condition associated with the one or more roads; and
   predicting an impact of the road condition on the one or more vehicles and the one or more roads.

5. The method of claim 4, further including:
   identifying a minimum vehicle speed for the one or more vehicles, wherein the minimum vehicle speed is based, at least in part, on the impact of the road condition on the one or more vehicles and the one or more roads.

6. The method of claim 4, further comprising:
   updating the optimal route based on the impact to form an updated optimal route; and
   dynamically assigning the optimal vehicle to the updated optimal route.

7. The method of claim 1, further comprising:
   analyzing the transportation data associated with the one or more road capabilities associated with the one or more roads;
   identifying a data gap from the transportation data, wherein the data gap is associated with the one or more roads; and
   recommending one or more additional smart devices for the one or more roads based, at least in part, on the data gap.

8. A system, the system comprising:
   a memory; and
   a processor in communication with the memory, the processor being configured to perform operations comprising:
   receiving transportation data associated with one or more vehicles and one or more routes having one or more roads;
   analyzing the transportation data for one or more vehicle capabilities associated with the one or more vehicles and one or more road capabilities associated with the one or more roads of the one or more routes, wherein the one or more road capabilities are based on a level of smartness associated with at least a portion of the one or more roads;

generating one or more simulations associated with the one or more roads and the one or more vehicles;

identifying, from the one or more simulations, one or more instances of vehicle damage, associated with a particular vehicle from the one or more vehicles, from one or more unexpected road conditions;

identifying an optimal vehicle from the one or more vehicles and an optimal route from the one or more routes, wherein identifying the optimal vehicle and the optimal route is based on the one or more simulations and the one or more unexpected road conditions, wherein the optimal vehicle is identified based on having no vehicle damage within the one or more simulations; and directing the optimal vehicle to the optimal route.

9. The system of claim 8, wherein the one or more simulations are based, at least in part, on one or more digital twins of the one or more roads and the one or more vehicles.

10. The system of claim 8, the processor being configured to perform additional operations comprising:

identifying one or more aggregated capabilities of the optimal vehicle and the optimal route.

11. The system of claim 8, the processor being configured to perform additional operations comprising:

simulating the transportation data associated with the one or more roads;

identifying a road condition associated with the one or more roads; and predicting an impact of the road condition on the one or more vehicles and the one or more roads.

12. The system of claim 11, the processor being configured to perform additional operations comprising:

identifying a minimum vehicle speed for the one or more vehicles, wherein the minimum vehicle speed is based, at least in part, on the impact of the road condition on the one or more vehicles and the one or more roads.

13. The system of claim 11, the processor being configured to perform additional operations comprising:

updating the optimal route based on the impact to form an updated optimal route; and dynamically assigning the optimal vehicle to the updated optimal route.

14. The system of claim 8, the processor being configured to perform additional operations comprising:

analyzing the transportation data associated with the one or more road capabilities associated with the one or more roads;

identifying a data gap from the transportation data, wherein the data gap is associated with the one or more roads; and recommending one or more additional smart devices for the one or more roads based, at least in part, on the data gap.

15. A computer program product, the computer program product comprising a computer readable storage medium having program instructions embodied therewith, the program instructions executable by a processor to cause the processors to perform a function, the function comprising:

receiving transportation data associated with one or more vehicles and one or more routes having one or more roads;

analyzing the transportation data for one or more vehicle capabilities associated with the one or more vehicles and one or more road capabilities associated with the one or more roads of the one or more routes, wherein the one or more road capabilities are based on a level of smartness associated with at least a portion of the one or more roads;

generating one or more simulations associated with the one or more roads and the one or more vehicles;

identifying, from the one or more simulations, one or more instances of vehicle damage, associated with a particular vehicle from the one or more vehicles, from one or more unexpected road conditions;

identifying an optimal vehicle from the one or more vehicles and an optimal route from the one or more routes, wherein identifying the optimal vehicle and the optimal route is based on the one or more simulations and the one or more unexpected road conditions, wherein the optimal vehicle is identified based on having no vehicle damage within the one or more simulations; and directing the optimal vehicle to the optimal route.

16. The computer program product of claim 15, wherein the one or more simulations are based, at least in part, on one or more digital twins of the one or more roads and the one or more vehicles.

17. The computer program product of claim 15, the function further comprising:

identifying one or more aggregated capabilities of the optimal vehicle and the optimal route.

18. The computer program product of claim 15, the function further comprising:

simulating the transportation data associated with the one or more roads;

identifying a road condition associated with the one or more roads; and predicting an impact of the road condition on the one or more vehicles and the one or more roads.

19. The computer program product of claim 18, the function further comprising:

updating the optimal route based on the impact to form an updated optimal route; and dynamically assigning the optimal vehicle to the updated optimal route.

20. The computer program product of claim 15, the function further comprising:

analyzing the transportation data associated with the one or more road capabilities associated with the one or more roads;

identifying a data gap from the transportation data, wherein the data gap is associated with the one or more roads; and recommending one or more additional smart devices for the one or more roads based, at least in part, on the data gap.

* * * * *